United States Patent [19]

Kondo et al.

[11] Patent Number: 5,304,247

[45] Date of Patent: Apr. 19, 1994

[54] APPARATUS FOR DEPOSITING COMPOUND SEMICONDUCTOR CRYSTAL

[75] Inventors: Makoto Kondo; Hiroshi Sekiguchi, both of Kawasaki, Japan

[73] Assignee: Fujitsu Limited, Kawasaki, Japan

[21] Appl. No.: 858,981

[22] PCT Filed: Sep. 20, 1991

[86] PCT No.: PCT/JP91/01262

§ 371 Date: May 21, 1992

§ 102(e) Date: May 21, 1992

[87] PCT Pub. No.: WO92/05577

PCT Pub. Date: Apr. 2, 1992

[30] Foreign Application Priority Data

Sep. 21, 1990 [JP] Japan ................... 2-252335

[51] Int. Cl.$^5$ ............................................ C23C 16/00
[52] U.S. Cl. ..................... 118/715; 437/107; 437/126; 437/132; 156/610; 156/611; 156/612; 156/613; 118/720; 427/248.1
[58] Field of Search ............... 156/610, 611, 612, 613; 437/132, 126, 107; 118/715, 720; 427/248.1

[56] References Cited

U.S. PATENT DOCUMENTS

| | | | |
|---|---|---|---|
| 4,066,481 | 1/1978 | Manasevit et al. | 148/174 |
| 4,368,098 | 1/1983 | Manasevit | 156/606 |
| 4,829,021 | 5/1989 | Fraas et al. | 437/81 |
| 4,980,204 | 12/1990 | Fujii et al. | 427/255.2 |
| 5,002,630 | 3/1991 | Kermani et al. | 156/610 |
| 5,138,973 | 8/1992 | Davis et al. | 118/723 |

FOREIGN PATENT DOCUMENTS

| | | |
|---|---|---|
| 0318395 | 5/1989 | European Pat. Off. |
| 58-176196 | 10/1983 | Japan |
| 60-81093 | 5/1985 | Japan |
| 1-140712 | 6/1989 | Japan |

Primary Examiner—Olik Chaudhuri
Assistant Examiner—Ramamohan Rao Paladugu
Attorney, Agent, or Firm—Staas & Halsey

[57] ABSTRACT

A crystal of a compound semiconductor is deposited on a substrate using a metal organic vapor phase epitaxy within a reaction enclosure having a vertical flow of deposition gas supplied through a gas injector within the deposition enclosure. The deposition gas is supplied in a plurality of divided flow paths in which the flow rates are individually controlled. The injector comprises a plurality of gas jet ports which receive respective, plural flow paths and which are disposed in a two-dimensional array having dimensions corresponding to the two-dimensional main surface dimensions of the substrate thereby to supply a uniform flow of deposition gas over the entire two-dimensional main surface of the substrate. The method and apparatus have special application in the deposition of quaternary III–V compound semiconductor.

8 Claims, 16 Drawing Sheets

APPARATUS FOR DEPOSITING COMPOUND SEMICONDUCTOR CRYSTAL

FIELD OF THE INVENTION

The invention relates to compound semiconductors produced by using a metal organic vapor phase epitaxy (MOVPE), which is a chemical vapor deposition (CVD) process. The invention particularly relates to a method and apparatus for depositing a III-V compound semiconductor crystal.

DESCRIPTION OF THE RELATED ART

Recently, as structure, properties and so forth of devices such as electronic or optical devices have become more advanced, a precise uniformity of the film thickness and composition, etc., of a semiconductor epitaxial growth film, which is a base of such a device, have been required.

Compound semiconductor crystals have hitherto been formed by a liquid epitaxial growth method, but this growth method is hard to control due to a high growth rate, and thus it has been difficult to satisfy recent, advanced requirements.

For this reason, attention is directed to an MOVPE process in which a semiconductor crystal is grown by pyrolyzing an organometallic compound and a hydride in a vapor phase, as a technique for epitaxially growing a uniform compound semiconductor crystal on a large area substrate or a plurality of substrates, for the liquid epitaxial growth process.

The furnaces of the MOVPE crystal growth are roughly classified into a horizontal CVD furnace and a vertical CVD furnace.

FIGS. 1 to 3 are illustrations showing the principal horizontal furnaces; in the drawings, 1 is a gas injector serving as an introducing port for introducing a deposition gas, 2 is a reaction tube, 3 is a substrate for deposition, 4 is a susceptor supporting the substrate 3, and 5 is a gas exhaust port.

FIG. 1 shows a typical horizontal CVD furnace.

In the horizontal furnace of this drawing, a substrate 3 is horizontally placed on a susceptor 4 installed on a reaction tube 2, and a deposition gas containing raw materials for deposition is substantially horizontally supplied to the substrate 3.

FIG. 2 shows a barrel-type furnace, as a further example of the horizontal CVD furnaces.

In the horizontal furnace of this drawing, a plurality of substrates 3 are placed on the side faces of a susceptor 4 provided in a reaction tube 2, and a deposition gas is supplied from above the reaction tube 2 substantially in parallel to the substrates 3. The susceptor 4 is then rotated so that variations among the crystals deposited on the substrates 3 do not occur. The individual substrates 3 are also rotated, to produce a uniform deposition on a surface of the substrate.

FIG. 3 shows a planetary-type furnace, as another of the horizontal CVD furnaces.

In the horizontal furnace of this drawing, a plurality of substrates 3 are placed on a susceptor 4 horizontally provided in a reaction tube 2, and a deposition gas introduced from the top of the reaction tube 2 is allowed to flow horizontally along the susceptor 4, from substantially the center of the susceptor 4 and radially outwardly, and thereby is supplied to the substrates 3.

These horizontal furnaces are commonly used when epitaxially growing GaAs for high speed devices and AlGaAs/GaAs systems for short wavelength optical devices by an MOVPE process, as the gas flow is relatively simple and the deposition on a large area substrate or a plurality of substrates is facilitated due to the respective structures thereof.

Nevertheless, the horizontal furnaces have the following three major problems:

First, since the deposition gas flows unidirectionally along the substrate surface, the horizontal furnaces have a problem with the growth of crystals on the substrate surface, i.e., due to the consumption of the deposition gas along the flow path, the concentration of the deposition gas becomes weaker in the upstream to downstream direction of the gas flow and, as a result, the crystal deposition rate on the surface of the deposition substrate becomes slower (i.e., gradually reduces) in that same upstream to downstream direction of the gas flow.

Second, a problem arises in that the deposition gas introduced into the horizontal furnace undergoes a temperature distribution in the flow path over the surface of the substrate, because the gas is gradually heated on the substrate in the upstream to downstream direction of the gas flow. This results in a distribution of the decomposition condition of the deposition gas on the substrate, as well as a distribution of the composition of the deposited crystal on the substrate.

Third, a problem arises in that, in the horizontal furnaces, a ceiling or wall of a reaction tube exists in the vicinity of a deposition substrate, and such a ceiling or wall has an effect on the deposition of the crystal on the substrate. Namely, reaction by-products are deposited on the ceiling or wall of the reaction tube during the repetition of the crystal deposition therein, which vary the degree of composition of the deposition gas and have an effect on the film thickness and composition of the crystal deposited on the substrate.

FIGS. 4 and 5 illustrate the above first problem, wherein FIG. 4 shows examples of isoconcentration lines of a gas on a substrate. These isoconcentration lines indicate that the deposition gas concentration becomes thinner and thinner (i.e., becomes weaker, or reduces) in the upstream to downstream direction of flow over the substrate.

FIG. 5 shows the effect due to the first problem of the distribution of the deposition gas concentration on a substrate, and exemplifies a distribution of a film thickness in a horizontal furnace. The abscissa axis is the distance from the upstream of the substrate, and the ordinate axis is the thickness of the deposited film. As can be seen in this drawing, the thickness of the film deposited on the substrate becomes thinner and thinner from the upstream side to the downstream side of the substrate.

This first problem, however, can be solved by making the crystal deposition rate uniform to a certain degree by rotating the deposition substrate. In addition, the second and third problems have not appeared in the case of binary compound semiconductors and ternary compound semiconductors consisting of two group III elements and one group V element, and therefore, have not had very significant effects on the deposition of AlGaAs/GaAs system crystals.

Nevertheless, the deposition of a quaternary compound semiconductor such as InGaAsP system crystals used for optical devices of the 1 micrometer wavelength band or AlGaInP systems used in visible light lasers, the second and third problems have a particularly significant influence.

First, the temperature distribution of a gas flow on a substrate has a significant effect on the solid phase composition of group V elements in the InGaAsP composition, since the thermal decomposition efficiencies of $AsH_3$ (arsine) and $PH_3$ (phosphine) of the group in an MOVPE deposition of InGaAsP differ greatly depending on a temperature. Therefore, the second problem in the horizontal furnaces is fatal to the deposition of the crystal of a quaternary compound semiconductor such as InGaAsP.

FIG. 4 also represents isothermal lines on a substrate. In this case, the lines show that the deposition gas has a higher and higher temperature as it flows further from upstream to downstream over the substrate.

FIG. 6 is a graph showing an effect due to the temperature distribution of the gas flow on a deposition substrate in the deposition of an InGaAsP system crystal, and illustrates a composition distribution in a horizontal furnace. In this drawing, the abscissa axis is the distance from the upstream of the deposition substrate, and the ordinate axis is the photoluminescence (PL) wavelength of the deposited InGaAsP crystal. A PL wavelength is the wavelength of light peculiar to a given substance and generated thereby, corresponding to the band gap of the substance, when irradiated by a certain light.

In the case of an InGaAsP crystal, this graph may be considered to substantially correspond to the composition ratio of As/P of the group V elements, because it has been verified that In and Ga of group III elements are deposited in an approximately uniform composition. This graph shows that the crystal deposited on the substrate has a composition in which As is decreased and P is increased from upstream to downstream. (A crystal containing more As has a larger PL wavelength than a crystal containing more P).

Also, for the above third problem, it has been confirmed, by experiments, etc., that deposits on the ceiling or wall of a reaction tube have significant effects on the uniformity of the group III solid phase composition, particularly the composition of In and Ga.

From the above, it can be considered that the use of a horizontal furnace causes difficulties in obtaining a uniform deposition of a III-V compound semiconductor crystal containing In and Ga or As and P together (such as InGaAsP, AlGaInP).

On the other hand, the problems as mentioned above do not exist in vertical furnaces, in principle.

FIG. 7 shows a typical vertical CVD furnace, wherein the same items as in FIG. 1 are designated by the same numerical signals.

In this vertical furnace, a substrate 3 is mounted on a susceptor 4 positioned horizontally in a reaction tube 2, and a deposition gas introduced from a gas injector 1 positioned above the reaction tube 2 is vertically supplied to the surface of the substrate 3.

A deposition gas is horizontally supplied to a substrate in the case of a horizontal furnace, but in a vertical furnace, since a deposition gas is vertically supplied to a substrate, the above mentioned first and second problems do not occur, in principle, if an ideal gas flow is realized. The third problem also does not occur because of the construction of the furnace, as no ceiling or wall of a reaction tube exists in the vicinity of the surface of a substrate.

In vertical furnaces, it is ideal to supply a gas having an equal concentration to the entire surface of a deposition substrate at an equal rate. Since the entire surface of the substrate can be in the same condition if this condition is satisfied, a crystal having a uniform film thickness and a uniform composition can be deposited on the substrate.

In general, however, it is extremely difficult to make the diameter of a gas injector (commonly less then 1 centimeter) close to the diameter of a substrate (generally 5 to 8 centimeters) and, even if this is achieved, it is difficult to supply a deposition gas having a uniform concentration from a gas injector with such a large diameter. In practice, a gas injector having a smaller diameter than the diameter of a substrate therefore must be provided above the center of the substrate. Consequently, the deposition gas introduced from the gas injector is concentrated at the central portion of the substrate, as shown in FIG. 7.

FIG. 8 illustrates the isoconcentration and isothermal lines of a gas flow over a substrate in a prior art vertical furnace. In this drawing, the closer the lines approach the substrate, the lower the concentration and the higher the temperature.

It has been found that the isoconcentration and isothermal lines vary greatly at the center of the substrate, as shown in the drawing, since the deposition gas is concentrated at the central portion of the substrate, as aforementioned.

FIG. 9 is a graph illustrating a film thickness distribution of an InGaAsP crystal deposited on a substrate in a prior vertical furnace. As a consequence of the large variation of gas concentration near the center above a substrate as shown in FIG. 8, the film thickness of a crystal deposited on the substrate has a distribution which becomes maximum near the center.

Similarly, FIG. 10 is a graph illustrating a composition distribution of an InGaAsP crystal deposited on a substrate in a convention vertical furnace. Again, in this drawing, the As/P composition ratio can be determined by detecting the PL wavelength at the face of a substrate, as in FIG. 6. It is found that the crystal deposited on the substrate has a composition distribution with large variations, as a consequence of the large variation of gas temperatures near the center of, and above, the substrate.

Furthermore, in the vertical furnaces, convection of the deposition gas occurs in a reaction tube as shown in FIG. 7, since the concentrated deposition gas is supplied to the central portion of a substrate as aforementioned. Therefore, the uniformity of the film thickness or composition of a crystal deposited on the substrates is subjected to variations due to the convection as well.

When a heterojunction, for example, is formed on a substrate, the abruptness of the heterointerface is adversely affected.

To improve the concentration of a deposition gas at the center of a substrate, as described above, the flow rate control technique may be used as proposed by the inventors in Japanese Unexamined Patent Publication No. 1-140712. In this technique, a plurality of sub-injectors are provided in such a manner that they face a substrate and are arranged along a centerline in the substrate plane, and a gas controlled at a given flow rate is supplied from each sub-injector toward the surface of the substrate, while being rotated.

Using this technique, both a film thickness and a composition can have an improved uniformity, as far as the deposition of a crystal of a binary compound semiconductor such as GaAs or a ternary compound semiconductor such as GaInAs is concerned, but when this technique is applied to the deposition of crystal of a quaternary compound semiconductor such as InGaAsP, the uniformity of the film thickness is good, but no improvement is found in the uniformity of the composition (particularly, the uniformity of the composition for As and P of group V elements in the deposited crystal), because in this case, only a part of the substrate is vertically supplied with a deposition gas directly from sub-injectors arranged along a centerline in the substrate.

That is, with the technique described in Japanese Unexamined Patent Publication No. 1-140712, since the deposition gas supplied from sub-injector strikes vertically against the portion of a substrate directly below the sub-injectors, and then the flow direction is laterally turned and flows along the surface of the substrate and toward the edge thereof, the gas is progressively heated in the upstream to downstream direction of the lateral flow, leading to the nonuniform temperature distribution of the gas over the substrate surface. Accordingly, although this technique was useful for supplying a deposition gas in an even concentration onto a substrate, it is still insufficient for making the temperature distribution of the gas flow as uniform as possible and thereby to maintain a constant ratio of the respective deposition rates of the group V elements.

DISCLOSURE OF THE INVENTION

The invention aims to provide an MOVPE method and apparatus by which a compound semiconductor crystal having a uniform film thickness and composition can be deposited on the entire surface of a substrate.

The method of depositing a compound semiconductor crystal of the invention, in which a deposition gas containing two or more material gases is supplied to a reaction chamber, and the material gases are pyrolyzed to thereby deposit a compound semiconductor crystal on a substrate placed in the reaction chamber, is characterized by dividing the stream of the deposition gas supplied to the reaction chamber into a plurality of streams, individually adjusting the respective flow rates of the divided streams, and the vertically supplying the plural divided streams having the respectively adjusted flow rates to the entire surface of the substrate through jet ports arranged in such a manner that they cover the entire surface of the substrate on which the crystal is to be deposited.

According to the invention, since a deposition gas is thus vertically supplied to the entire surface of a substrate as divided streams and at respective, adjusted flow rates, ideal isoconcentration lines and isothermal lines, which are parallel to the substrate surface, can be realized.

Thus, the rotation of a substrate conventionally adopted in the prior art, in which only a part of the substrate surface is straightly and vertically supplied with a deposition gas is unnecessary in the present invention, in principle, as the isoconcentration lines and the isothermal lines of the deposition gas are parallel to the entire substrate surface. In practice, rotating a substrate compensates for any distortions of the isoconcentration and isothermal lines resulting from various factors in an apparatus, for example, a variance among individual jet ports supplying the individual divided gas streams, and a variance among the individual flowmeters controlling the respective flow rates of the divided streams. In this case, however, the rotation of the substrate may be slower than in the conventional case.

The method of deposition of a compound semiconductor of the invention can be carried out by means of an apparatus for depositing a compound semiconductor crystal, comprising (a) a gas supply system supplying a deposition gas, containing two or more material gases for forming a crystal of a compound semiconductor, to a reaction chamber, (b) a reaction system consisting of a reacting enclosure for defining the extent of the reaction chamber and depositing the crystal of the compound semiconductor therewithin, a susceptor provided in the reacting enclosures for mounting thereon a substrate on which the compound semiconductor crystal is to be deposited, a gas injector for vertically supplying the deposition gas to the substrate on the susceptor, provided at the top of the reaction enclosure and facing the susceptor, and a means for heating the substrate, and (c) a gas exhaust system for exhausting the spent deposition gas containing a by-product of a pyrolysis reaction of the material gases in the reaction chamber to the outside of the reaction enclosure, the apparatus being characterized in that the gas supply system has a plurality of divided flow paths for the deposition gas, and control means are provided in each of the divided flow paths for individually and respectively adjusting the flow rates of the deposition gas in the flow paths, the gas injector in the reaction system consisting of a plurality of sub-injectors densely aggregated in such a manner that they cover the entire surface of the substrate placed on the susceptor, and the plural, divided flow paths of deposition gas, having the individually and respectively controlled flow rates are connected to the respective sub-injectors one by one.

In a preferred embodiment of the invention, the gas injector is a centrally positioned sub-injector and a group of further sub-injectors positioned around the central sub-injector.

The sub-injector may be a tube of an appropriate size, and those having a sectional shape of circle, square, regular hexagon or the like may conveniently used, provided that a gas is uniformly blown up. If tubes are used which can be densely bundled without any gap therebetween, such as square or regular hexagonal tubes, the flow area of gas can be increased to thereby reduce the gas residence sections. In this case, when the end of each of the sub-injectors is obliquely spread out, the gas residence sections are more effectively eliminated.

The sub-injectors may be made, for example, of a metal (stainless steel or the like) or quartz. To obliquely spread out the end of the injector, as described above and for example, machining may be used when the material is a metal, and etching may be utilized when the material is quartz.

To realize isoconcentration-isothermal lines substantially parallel to the surface of a substrate, it is advantageous to axially, symmetrically arrange the sub-injectors forming a gas injector. Moreover, preferably the gas injector is formed of groups of sub-injectors arranged in such a manner that they cover the entire surface of the substrate, by separating the groups into at least two areas respectively at the center and at the outside adjacent thereto; more preferably, the gas injector is formed of groups of sub-injectors disposed in such a manner that they cover the entire surface of the substrate, by separating the gas injector into at least three areas respectively the center, the outside end, and a point intermediately therebetween, although this also depends on the size of the substrate.

Thus, the size and number of sub-injectors required are determined depending on the size of the substrate and the structure of the gas injector. For example, when using circular section tubes for a 2 inch substrate, to cover the entire surface of the substrate by separating it into three areas of the center, the outside end, and intermediately therebetween, a sub-injector can be placed at the center, six sub-injectors disposed therearound, and twelve further sub-injectors disposed around the six sub-injectors; the outer diameter of each sub-injector may be on the order of 10 millimeters. When using regular-hexagonal sub-injectors and triply arranging 19 sub-injectors as in the above example, sub-injectors having a side length of a hexagon of about 7 millimeters may be used for a 2 inch substrate, and sub-injectors having a side length of about 10 millimeters may used for a 3 inch substrate, for example.

Generally, sub-injectors having too large a size make the realization of the isoconcentration-isothermal lines referred to above more difficult, whereas a reduction of the size leads only to an increase of the numbers of the divided streams and the respective flow rate control means, which thereby complicates the apparatus. Concerning sub-injectors with a circular section, it is common to use those having a diameter of 10 to 20 millimeters, with those having a diameter of 10 to 16 millimeters being preferably used. For regular-hexagonal sub-injectors, it is common to use those having a side length of 5 to 15 millimeters.

The flow rate control means in the gas supply system independently controls the deposition gas flow rate in each divided flow path, but it is preferable to adjust the flow rates of deposition gas by the respective control means in such a manner that, for each of three areas of the center, the end, and intermediately therebetween, the flow rates supplied from the respective sub-injectors are constant. Concerning the flow rates of the respective sub-injectors in the three areas, although crystals having a further improved uniformity in both film thickness and composition than those of conventional crystals have been obtained at the same flow rate for all of the sub-injectors, by the inventors' experiments, it is useful, for the improvement of uniformity at the end area, to make the flow rate of the deposition gas in the sub-injector of the end area slightly more than that of the inner areas. Thus, the ratio of the flow rates to be distributed to respective divided flow paths should be determined depending on the apparatus and deposition gas used, the deposition conditions and the like, for producing a crystal having a uniform film thickness and composition on the substrate.

The divided flow paths in the gas supply system may be further divided downstream of the flow rate control means, and these subdivided flow paths may be connected to the separate sub-injectors one by one. In this case, the subdivided flow paths divided from a common divided flow path should be connected to the sub-injectors of the same area to which the deposition gas be supplied therethrough.

In the gas supply system, a manifold may be provided for mixing material gases and a carrier gas, to prepare a deposition gas; and the flow path of the deposition gas supplied from the manifold can be divided, and the gas flow rates of the respective divided flow paths can be independently controlled by means of a mass flow controller provided in the respective flow paths.

The method and apparatus of the invention are particularly suitable for the depositing of a crystal of a compound semiconductor containing two or more group V elements, the composition ratio of which is particularly susceptible to the temperature distribution of the decomposition gas on a substrate, such as InGaAsP, because, according to the method and apparatus of the invention, not only isoconcentration lines parallel to the surface of the substrate on which the crystal is to be deposited but also isothermal lines, likewise parallel thereto, can be realized on the substrate.

The number of substrates on which a crystal of a compound semiconductor is to be deposited in the method and apparatus of the invention can be more than one, and may, of course, be two or more.

The other objects and advantages of the present invention will be self-evident from the following description made with reference to the attached drawings.

DETAILED DESCRIPTION OF THE INVENTION

Figure 1:
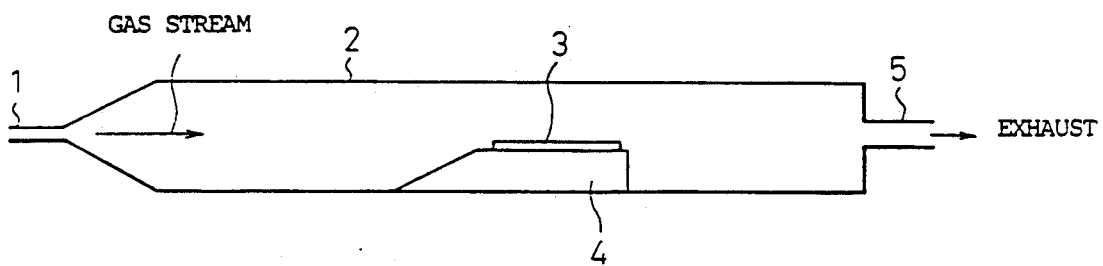
FIG. 1 is an illustration of a typical prior horizontal CVD furnace.
Figure 2:
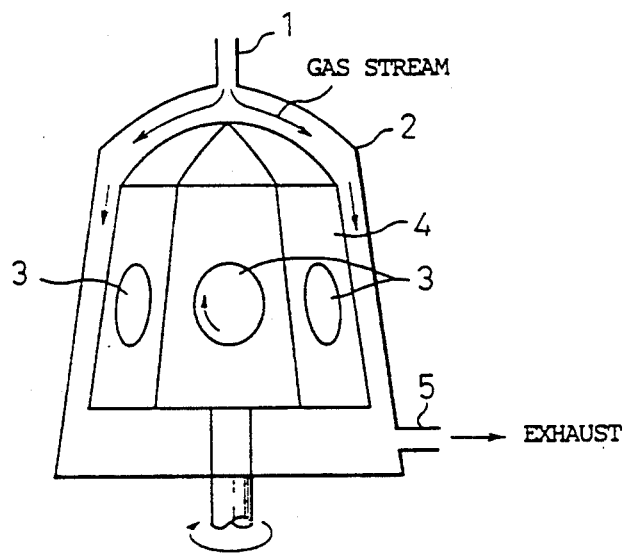
FIG. 2 is an illustration of a prior barrel-type furnace.
Figure 3:
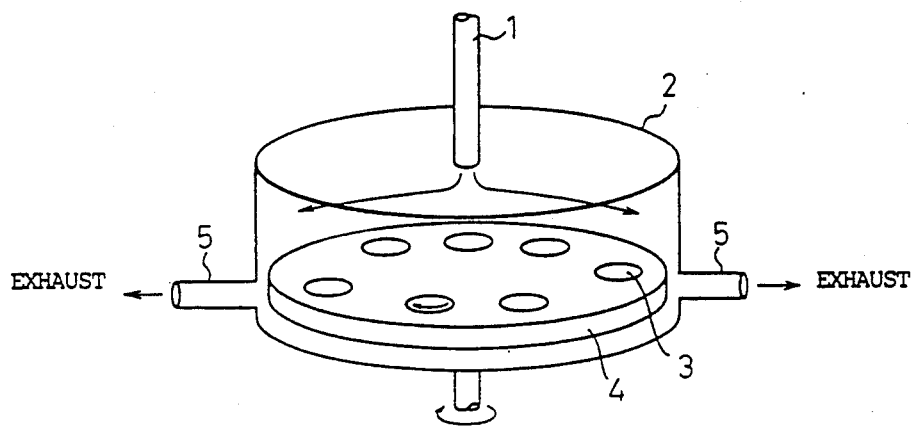
FIG. 3 is an illustration of a prior planetary-type furnace.
Figure 4:
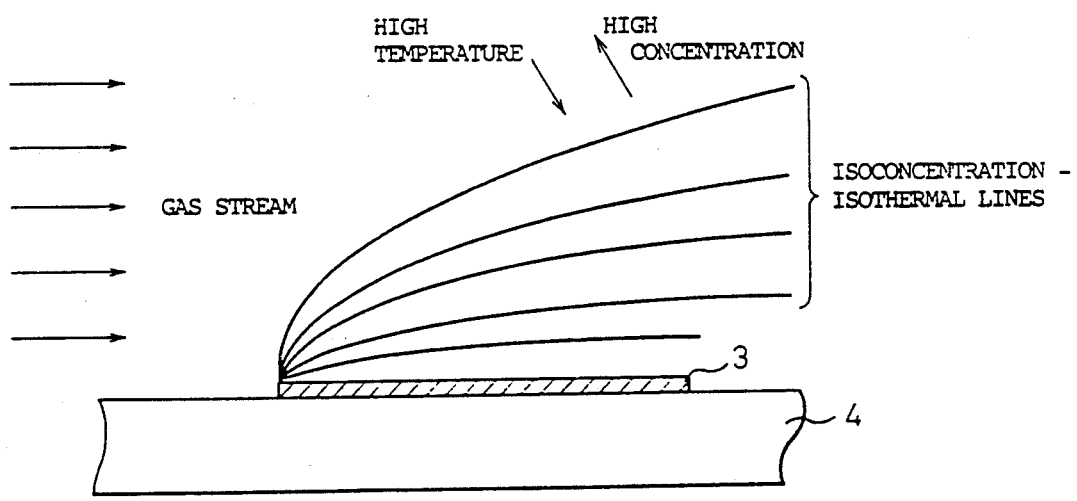
FIG. 4 is an illustration showing examples of isoconcentration and isothermal lines in a horizontal furnace.
Figure 5:
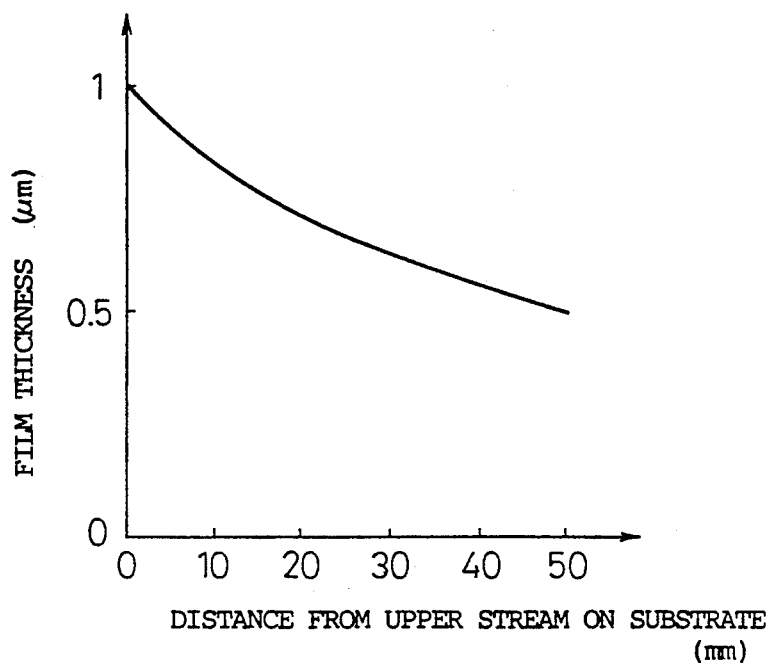
FIG. 5 is a graph illustrating a film thickness distribution in a horizontal furnace.
Figure 6:
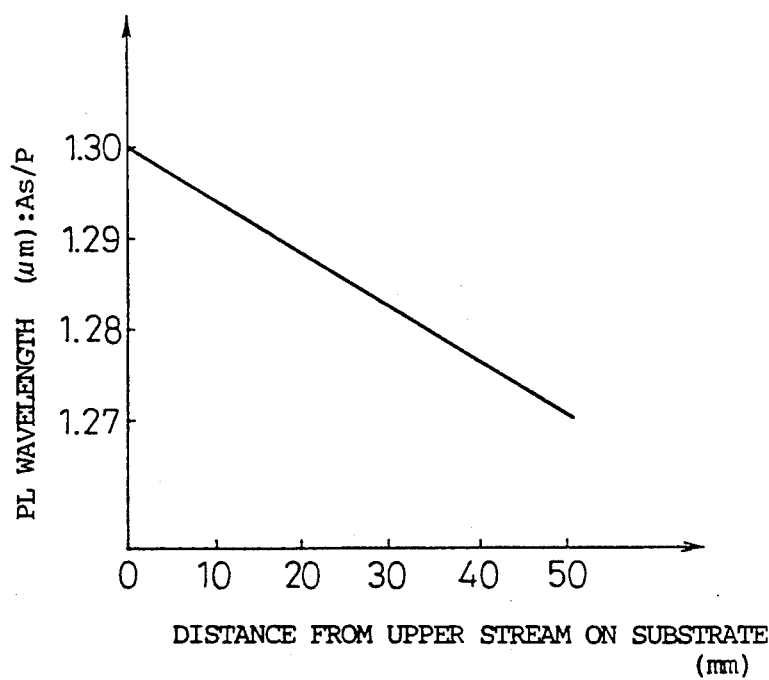
FIG. 6 is a graph showing a composition distribution in a horizontal furnace.
Figure 7:
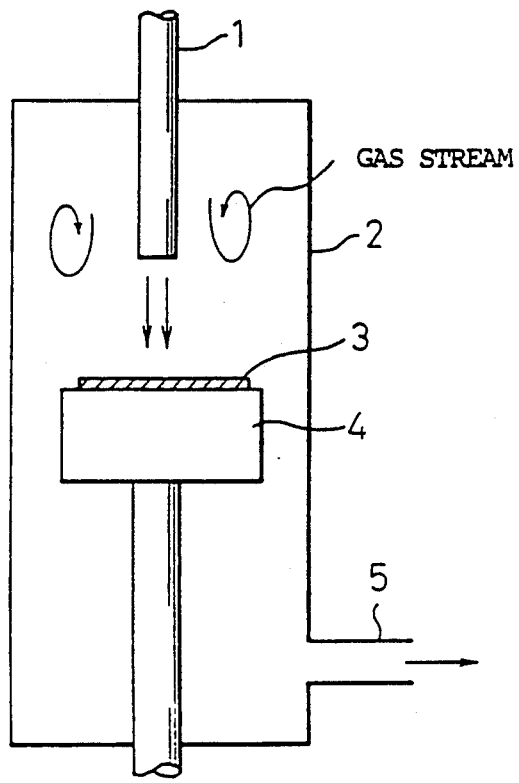
FIG. 7 is an illustration of a typical prior vertical CVD furnace.
Figure 8:
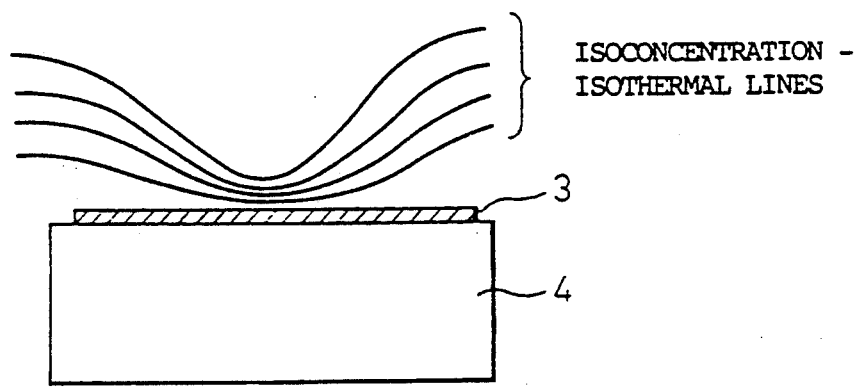
FIG. 8 is an illustration showing examples of isoconcentration and isothermal lines in a prior vertical furnace.
Figure 9:
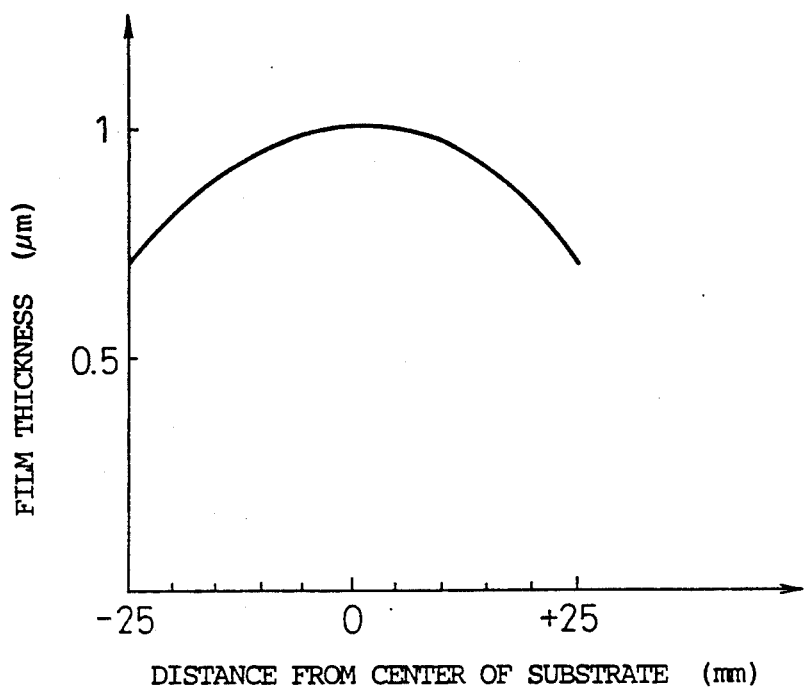
FIG. 9 is a graph illustrating a film thickness distribution in a prior vertical furnace.
Figure 10:
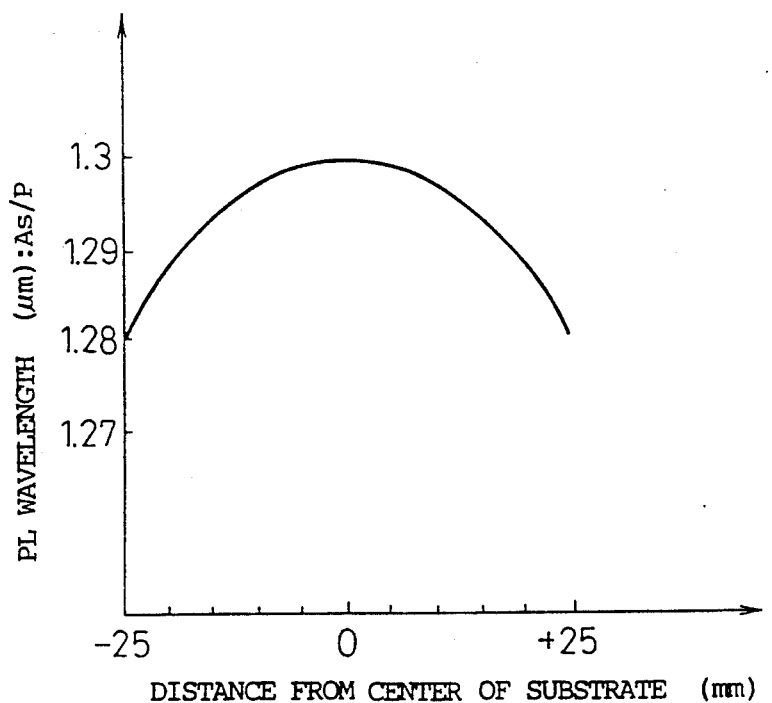
FIG. 10 is a graph illustrating the composition distribution in a prior vertical furnace.
Figure 11:
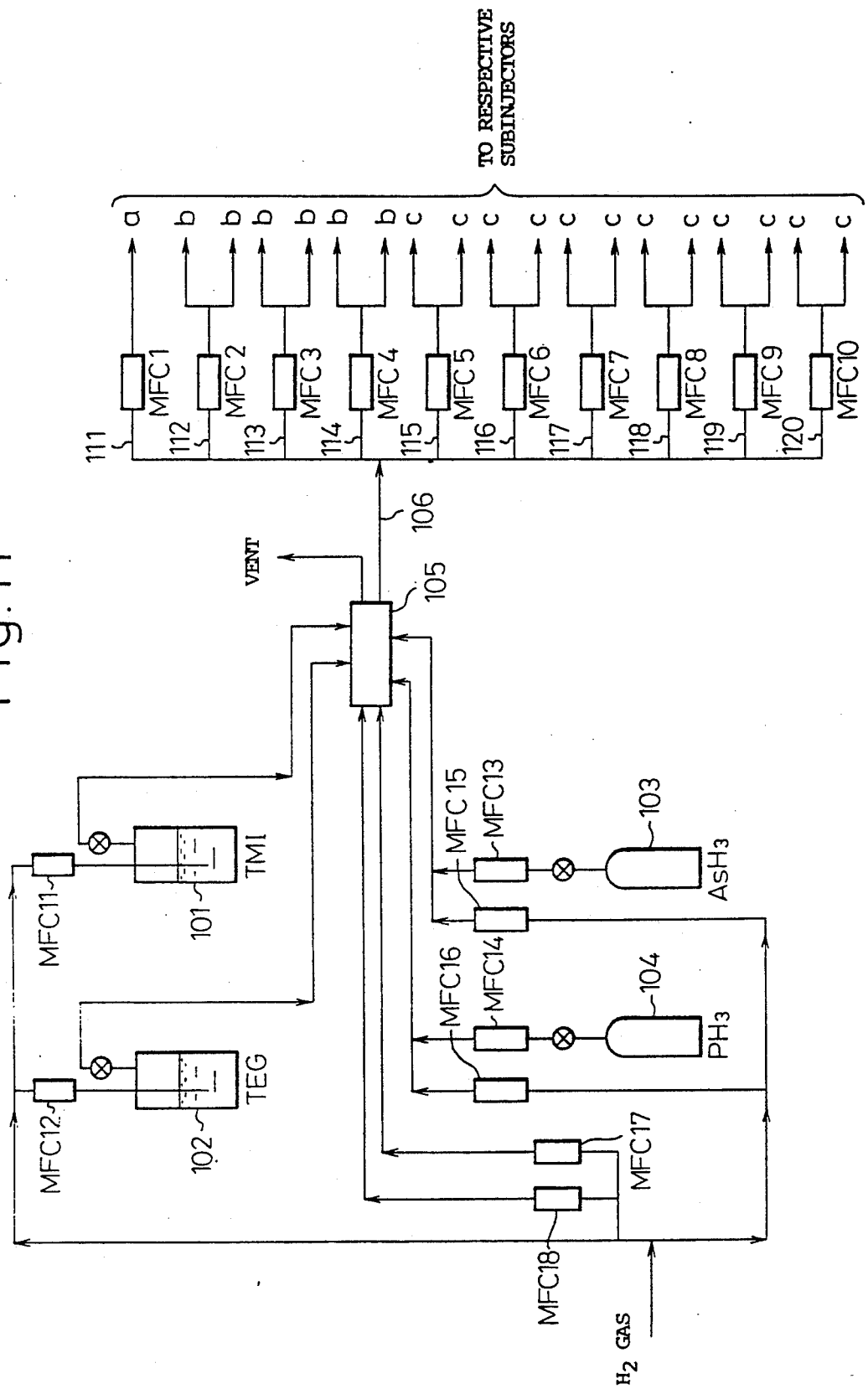
FIG. 11 is an illustration of a gas supply system in an apparatus of the invention.
Figure 12:
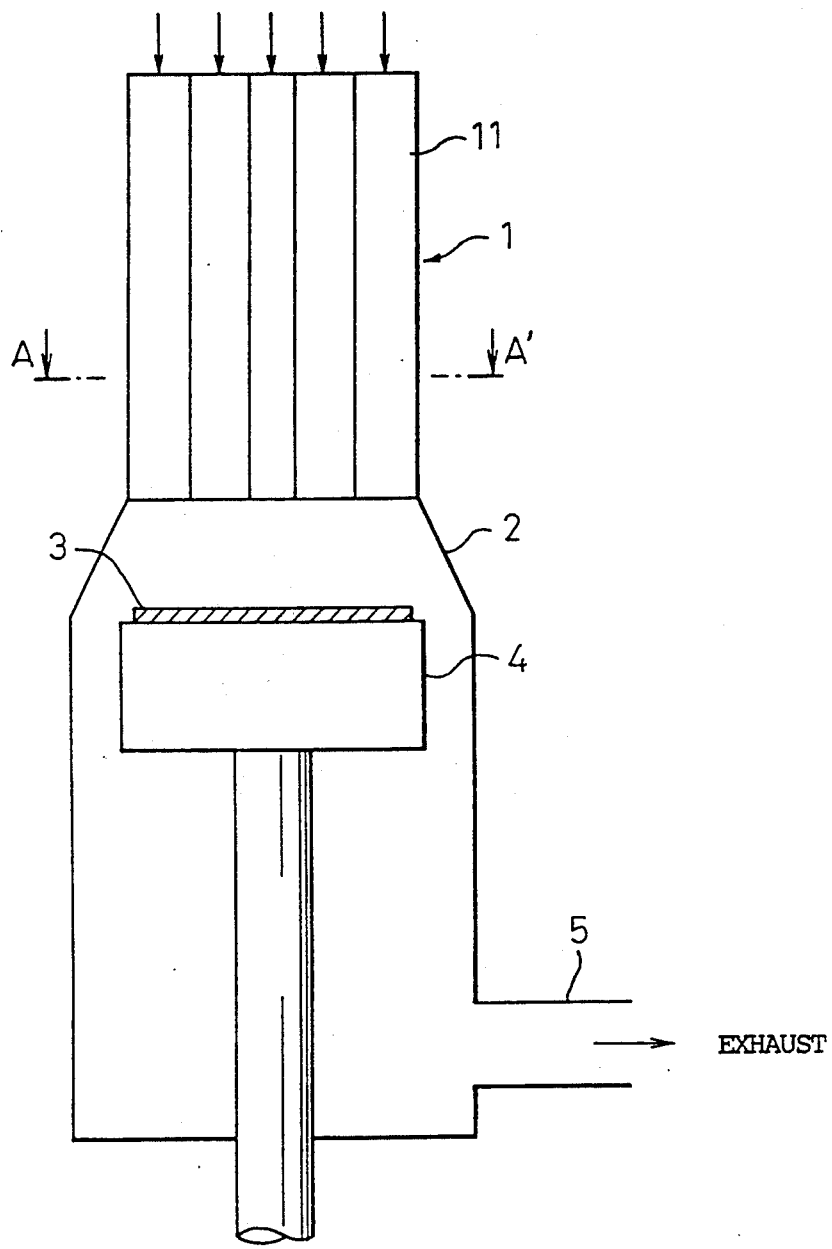
FIG. 12 is an illustration of a reaction system in an apparatus of the invention.

FIGS. 11 and 12 schematically show a gas supply system and a reaction system in an apparatus for carrying out the method of the invention, respectively. In FIG. 12, the same items as in FIG. 1 are designated by the same numerical signs.

Although only the gas sources of trimethylindium (TMI, $In(CH_3)_3$), triethylgallium (TEG, $Ga(C_2H_5)_3$), phosphine ($PH_3$), and arsine ($AsH_3$), which are raw materials for depositing a crystal of a quaternary compound semiconductor, InGaAsP, are illustrated in the gas supply system of FIG. 11, it is understood that other gas sources required when forming, for example, a heterojunction, although omitted, may additionally be provided. In this drawing, the TMI and TEG of organometallic raw material gases are transported to a manifold 105 together with hydrogen of a carrier gas supplied to respective bubblers 101 and 102, the flow rates of which are separately controlled by mass flow controllers MFC11 and MFC12. Arsine and phosphine are transported from respective bombs (i.e., tanks or gas cylinders) 103 and 104 to the manifold 105, the flow rates thereof being respectively controlled by mass flow controllers MFC13 and MFC14, and respectively combined with hydrogen gas, the flow rate of which is also controlled by an MFC15 or MFC16 Hydrogen, as a diluting a gas, is also supplied to the manifold 105, the flow rate of which is controlled by MFC17 and MFC18.

Figure 13:
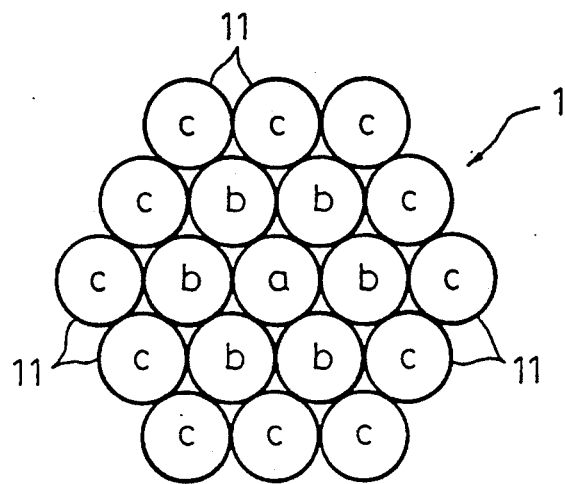
FIG. 13 is a cross section taken along the line A—A' in FIG. 12.

The deposition gas mixed in the manifold 105 is divided from the flow path 106 into ten divided flow paths 111 to 120, and the flow rates of these flow paths are controlled by respective mass flow controllers MFC1 to MFC10. In the drawing, the respective flow paths from MFC2 to MFC10. In the drawing, the respective flow paths from MFC2 to MFC10 are further subdivided into two flow paths each, and by way of the thus flow-controlled and divided 19 flow paths, the deposition gas is supplied to each of the sub-injectors which, in the composite, comprise the gas injector of the reaction system. The symbols a, b, and c given at the right of the 19 divided flow paths in this drawing correspond to the symbols a, b, and c used for identifying the sub-injectors later described in FIG. 13.

A reaction system of the invention shown in FIG. 12 is formed of a reaction enclosure 2, a gas injector 1 provided at the top of the enclosure, a susceptor 4 on which a substrate for depositing a crystal is mounted, and a gas exhaust port 5.

A means of heating the substrate 3 is provided in the reaction system, although not shown in the drawing. The heating means may be a heater provided in the susceptor 4 or a radio-frequency heating coil provided outside the reaction enclosure 2, as in conventional apparatuses.

The gas injector 1 is formed by densely aggregating (i.e., assembling) a plurality of sub-injectors 11 so as to include, for example, a central sub-injector a, a group of intermediate sub-injectors b surrounding said sub-injector a, and a group of outer sub-injectors c located further outside and surrounding the group of intermediate sub-injectors b, in such a manner that the gas injector 1 covers the entire surface of the substrate 3 on the susceptor 4, and vertically supplies the deposition gas from the sub-injectors to the entire surface of the substrate.

Figure 14:
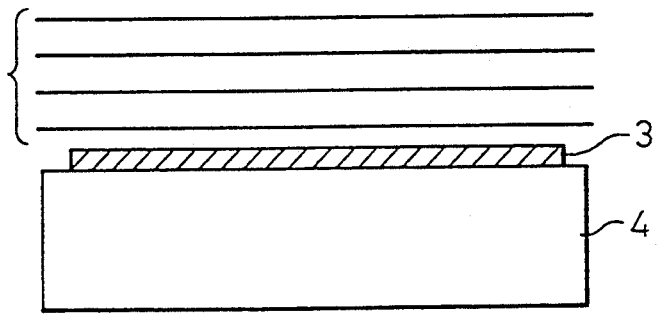
FIG. 14 is an illustration of isoconcentration and isothermal lines on a substrate in the invention.

By vertically supplying the deposition gas of each flow path divided and flow-controlled in the gas supply system, from the sub-injectors 11 thus formed, to the entire surface of the substrate 3, isoconcentration-isothermal lines can be realized which are parallel to the substrate surface, as schematically shown in FIG. 14. This phenomenon, i.e., that isoconcentration-isothermal lines parallel to the main surface of the heated planar substrate can be realized by adequately controlling the velocity of each flow line constituting a mixed gas flow supplied onto the substrate, is mathematically proven in Hermann Schilichting, "Boundary-Layer Theory", McGraw-Hill Publishing Company, New York (1968). In FIG. 14, the closer the lines are to the substrate, the lower the concentration and the higher the temperature.

The gas flow rate to be introduced into each sub-injector for obtaining isoconcentration-isothermal lines parallel to a substrate surface should be optimized depending on conditions such as the shape and size of the reaction enclosure, and deposition conditions of the crystal. When the gas flow rate is controlled, the most realistic method is that in which each of the respective flow rates for the central sub-injector a, the group of intermediate sub-injectors b, and group of outer sub-injectors c is separately controlled.

Figure 15:
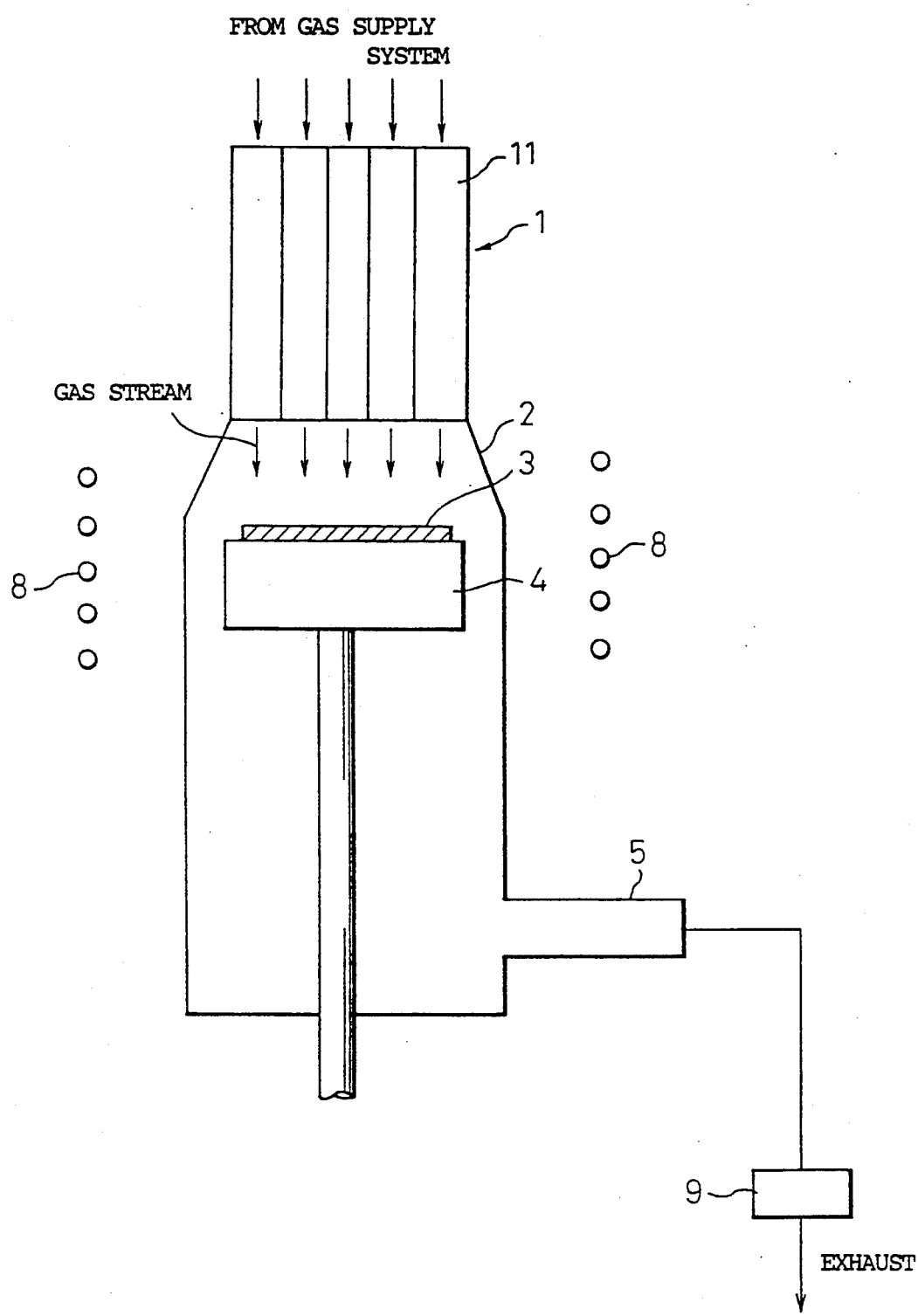
FIG. 15 is a schematic view of the deposition device in an embodiment of the invention.
Figure 16:
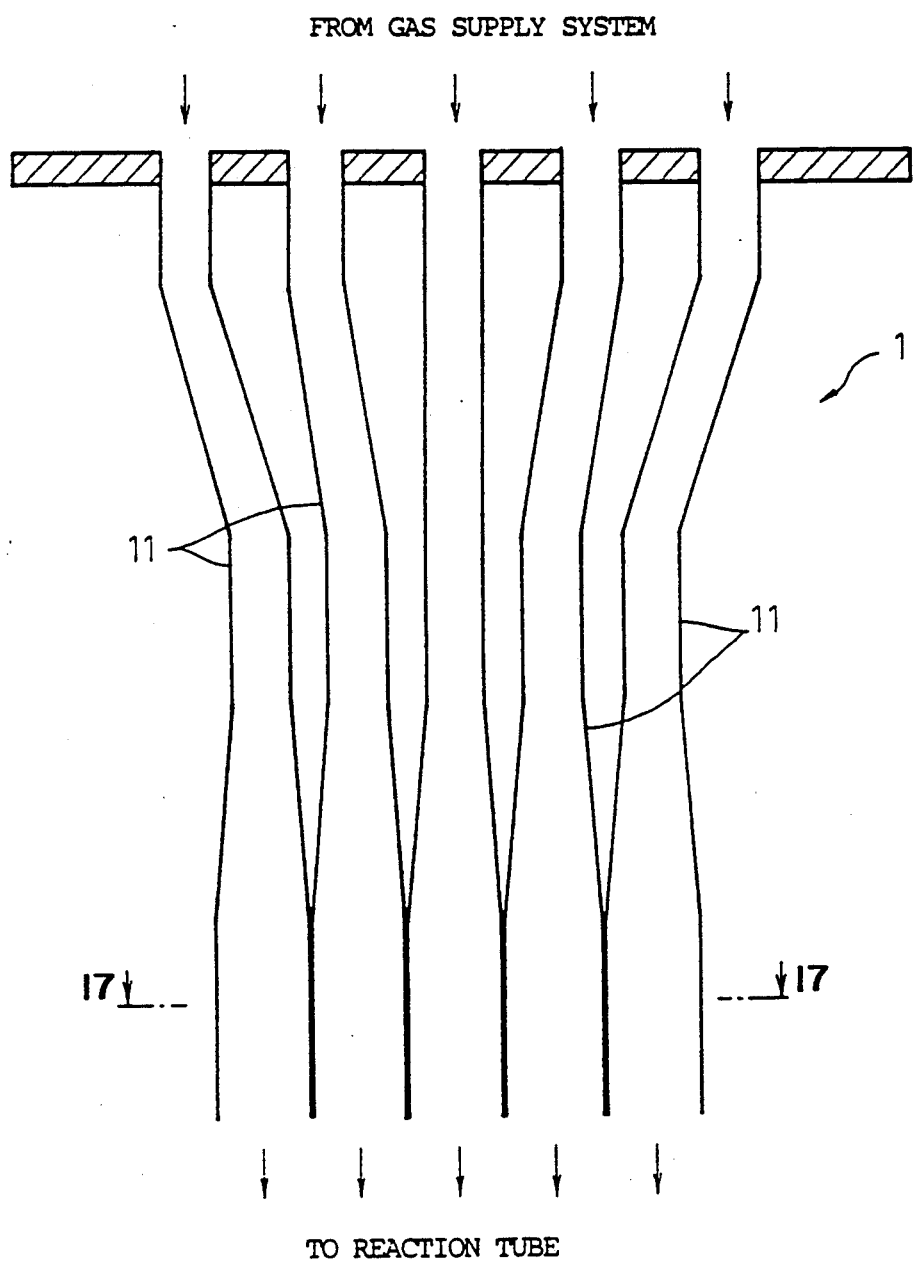
FIG. 16 is a cross section of the gas injector in an embodiment of the invention.

FIG. 15 is a schematic view of reaction and gas exhaust systems of deposition apparatus in an embodiment of the invention. FIG. 16 is an enlarged sectional view of a gas injector in this embodiment, and FIG. 17 is a sectional view taken in a plane along the line 17—17 in FIG. 16.

In FIG. 15, a gas injector made of quartz is designated by 1, and consists of sub-injectors 11 connected to respective divided flow paths in a gas supply system. In the drawing, 2 is a reaction tube, also made of quartz, 3 is a substrate on which a crystal is to be deposited, 4 is a susceptor, made of carbon, for supporting the substrate 3, 5 is a gas exhaust port, 8 is a radio-frequency heating coil for indirectly heating the substrate 3 on the susceptor 4 by heating said susceptor 4, and 9 is a rotary pump for creating a vacuum in the reaction tube 2.

The vertical section of the gas injector 1 in this embodiment has a structure as shown in FIG. 16. The length from the inlet (connected to a gas supply system) to the outlet (connected to the reaction tube 2) is, for example, about 150 millimeters, and the distance between the respective sub-injectors 11 is about 30 millimeters near the inlet and about 2 millimeters near the outlet.

Figure 17:
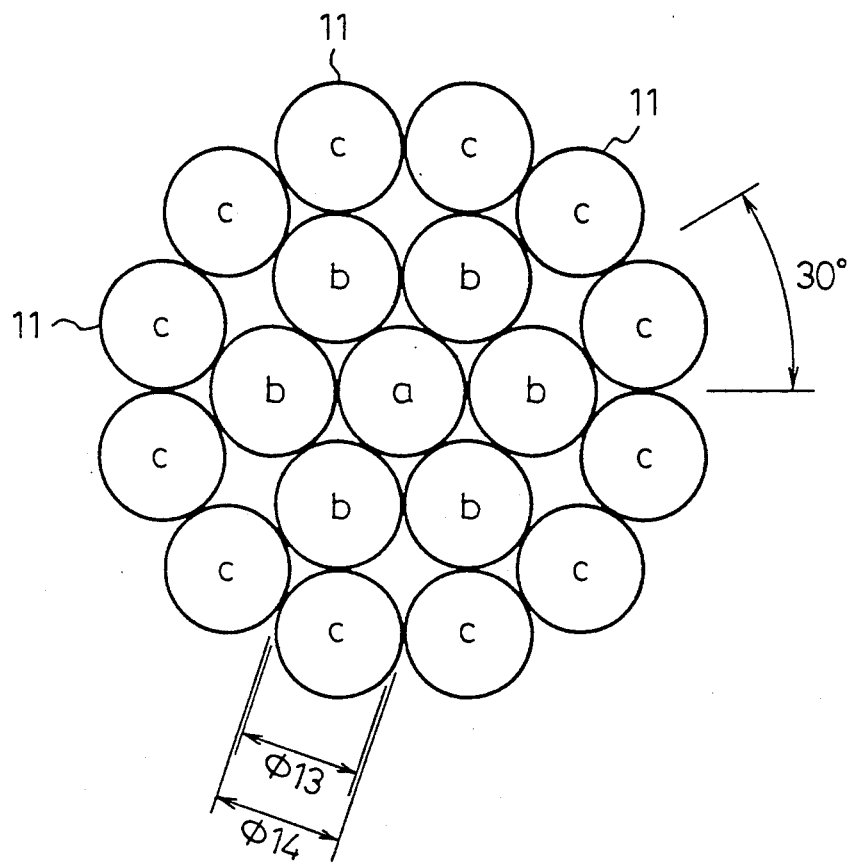
FIG. 17 is a cross section taken along the line 17—17 in FIG. 16.

The cross-section in the plane along line 17—17 in FIG. 16 is shown in FIG. 17. In this embodiment, 19 sub-injectors 11 having a circular section are provided in such a manner that they cover the entire surface of the substrate 3. The structure in this drawing is formed by a central sub-injector a, a group of intermediate sub-injectors b surrounding the sub-injector a, and a group of outer sub-injectors c further surrounding the group of sub-injectors b. The sub-injectors c in the outermost group are positioned, for example, by defining a center angle of 30 degrees relative to the sub-injector a, as the center; the individual sub-injectors 11 have an inner diameter of, e.g., 13 millimeters, and an outer diameter of 14 millimeters.

Furthermore, the inner diameter of each sub-injector 11 may be varied according to the size of the substrate 3. When a deposition is made for a plurality of substrates 3, the number of sub-injectors 11 may be increased depending on the area of the susceptor 4 on which the substrates 3 are mounted, to thereby enlarge the gas injector 1.

The gas supply system in this embodiment is as shown in FIG. 11. The material gases of trimethylindium, triethylgallium, arsine and phosphine are transported to a manifold 105 together with hydrogen of a carrier gas, and mixed with hydrogen of a carrier gas therein to thereby form a deposition gas. The deposition gas passes through a flow path 106, and is divided into ten flow paths 111 to 120, the flow rates thereof being separately controlled by mass flow controllers MFC1-10 in the respective divided flow paths.

A crystal of InGaAsP of a quaternary III-V compound semiconductor is formed from said gaseous materials, and when arsine of these four gaseous materials is replaced by, e.g., trimethylaluminum of an organic aluminum compound, a crystal of AlGaInP of a different quaternary III-V compound semiconductor can be obtained.

As is obvious from this drawing, in the present embodiment, each of the MFC2-10 controllers controls the gas flow rate supplied to two of the sub-injectors 11. Although all of the sub-injectors 11 may be, of course, controlled by separate mass flow controllers, 19 mass flow controllers will then be required for 19 sub-injectors 11. In contrast, the present embodiment can be carried out by using only 10 mass flow controllers, but even in this case, the groups of sub-injectors a, b, and c are preferably independently controlled.

In the present embodiment, the deposition of crystal on a substrate is carried out as follows:

Raw material gases and a carrier gas are first mixed in a manifold 105 to prepare a deposition gas. The flow of this deposition gas is divided and supplied to 10 mass flow controllers MFC1-10. The plural gas flows, controlled at given flow rates by the respective mass flow controllers, are supplied to 19 sub-injectors 11. At this time, for example, the flow path downstream of the MFC1 controller is connected to a sub-injector a, each of the respective flow paths downstream of the MFC2-4 controllers is further divided into two paths and each is connected to a corresponding one of the group of sub-injectors b, each of the respective flow paths downstream of the MFC5-10 controller is also divided into two and each is connected to a corresponding one of the group of sub-injectors c. The gas flow supplied to each sub-injector 11 is vertically supplied to the surface of a substrate 3 mounted on a susceptor 4, and as a result, the deposition gas having a uniform concentration and a uniform temperature can be supplied to the entire surface on the substrate 3.

The results obtained in the embodiment are shown below. The deposition conditions were as follows:

| | |
|---|---|
| deposition substrate: | InP |
| deposited layer: | InGaAsP |
| deposition temperature: | 570° C. |
| pressure: | 50 torr |
| total gas flow rate: | 8 liter/min. |
| gas flow velocity: | about 2 m/s |
| deposition rate: | 1 μm/h |
| raw materials for deposition: | trimethylindium (TMI) triethylgallium (TEG) arsine (AsH3) phosphine (PH3) |
| carrier gas: | hydrogen (H2) |

Figure 18:
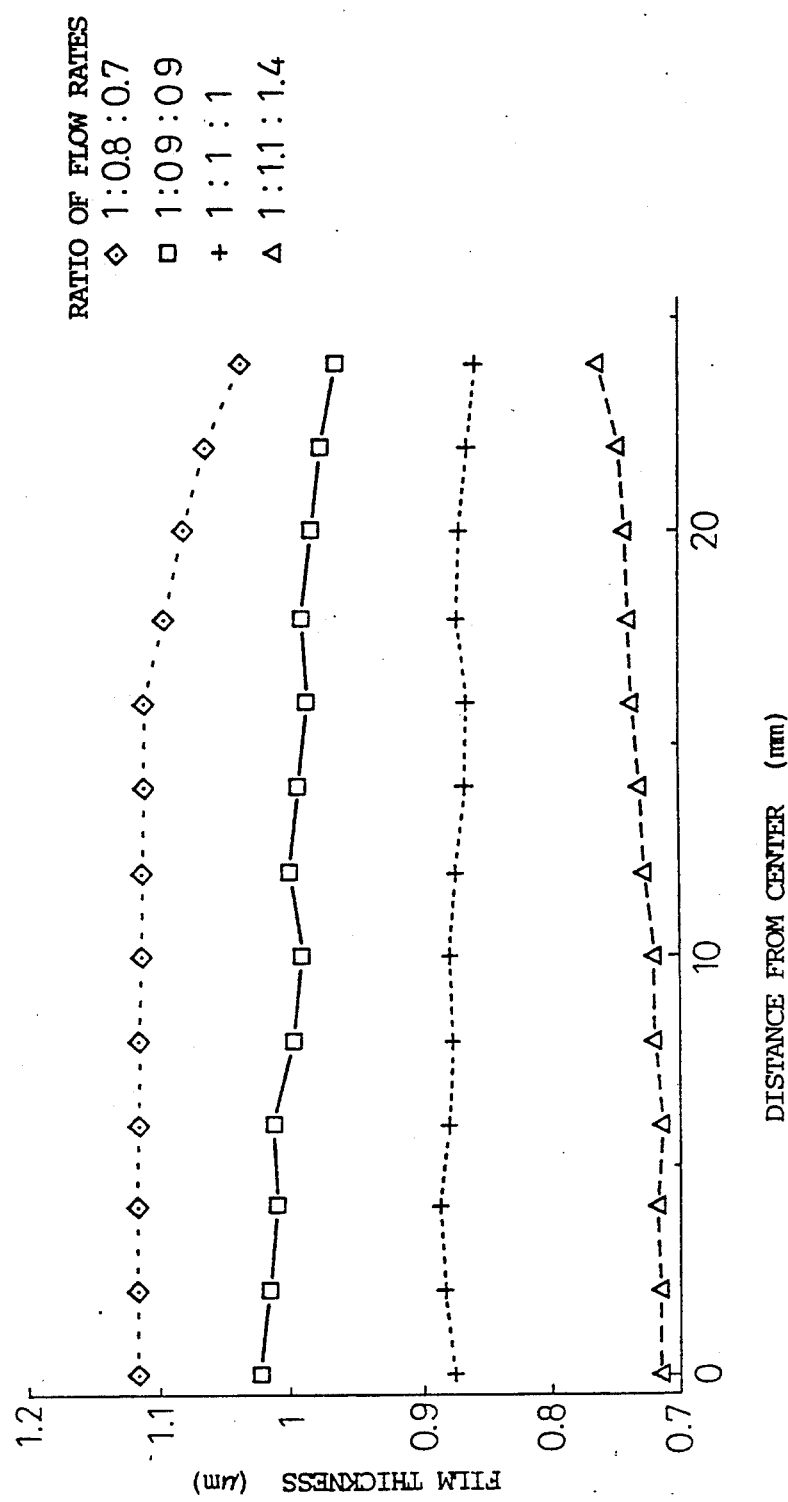
FIG. 18 is a graph showing film thickness distributions of InGaAsP layers deposited on a 2 inch InP substrate in the invention.

FIG. 18 is a graph showing distributions of the film thickness of InGaAsP layers deposited on 2 inch InP substrates according to the invention. The abscissa axis is the distance from the center of a substrate, and the ordinate axis is the deposited film thickness. Four lines in the drawing show the ratio [a, b, c] of the deposition gas flow rates supplied to each of the sub-injectors 11 in the respective groups a, b, and c, the ratios being [1 : 0.8 : 0.7], [1 : 0.9 :0.9], [1 : 1 : 1], and [1 : 1.1 : 1.4] from the uppermost line.

As shown in this drawing, when the flow rate in the radial direction was made approximately even by making the flow rate ratio of [1 : 1 : 1], the greatest uniformity of the film thickness was obtained.

Figure 19:
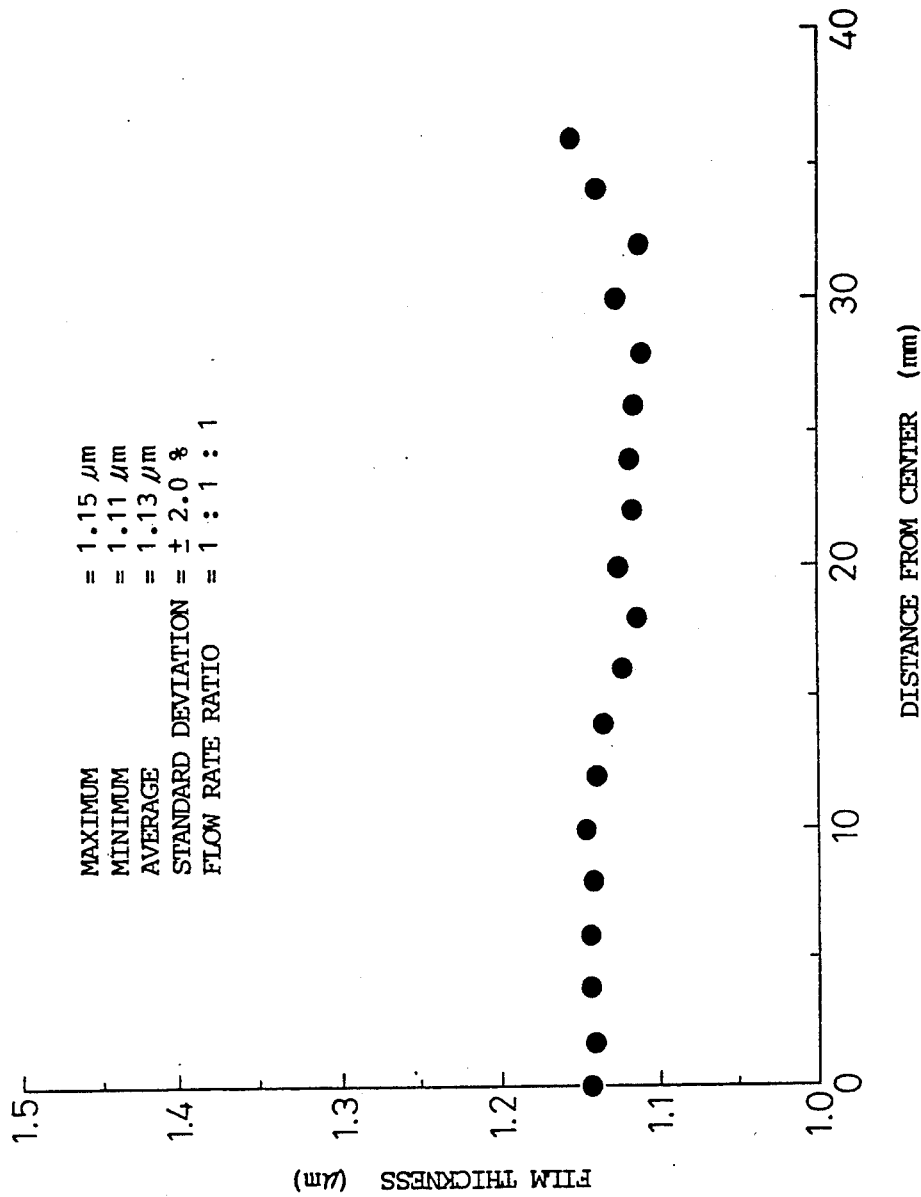
FIG. 19 is a graph showing a film thickness distribution of an InGaAsP layer deposited on a 3 inch InP substrate in the invention.

FIG. 19 is a graph showing the distribution of the film thickness of an InGaAsP layer deposited on a 3 inch InP substrate according to the invention, in which the ordinate and abscissa axes are the same as in FIG. 18. In this case, the flow rate ratio [a, b, c] of the deposition gas supplied to the sub-injectors was [1 : 1 : 1].

In this condition, a deposited film having a thickness of a maximum of 1.5 micrometers, a minimum of 1.11 micrometers, and an average of 1.13 micrometers was obtained. The standard deviation is ±2.0 percent. Considering that this value was ±10 to 15 percent in prior art vertical furnaces using a single gas injector, it is apparent that the uniformity of film thickness has been greatly improved. In this connection, in the vertical furnace using the flow rate control technique described in Japanese Unexamined Patent Publication No. 1-140712 previously disclosed by the inventors, the standard deviation in a deposited film thickness was on the order of ±3 percent.

Figure 20:
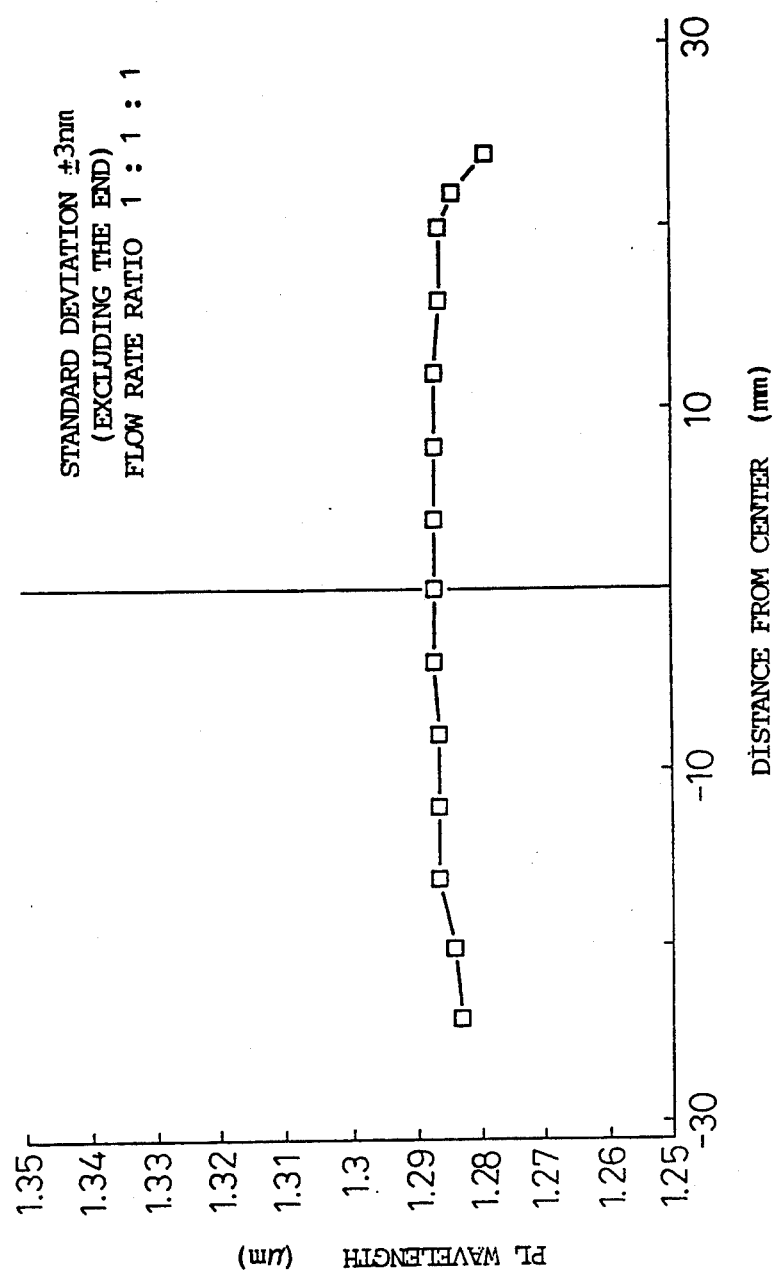
FIG. 20, is a graph showing a composition distribution of an InGaAsP layer deposited on a 2 inch InP substrate in the invention.

FIG. 20 is a graph showing the distribution of composition of an InGaAsP layer deposited on a 2 inch InP substrate according to the invention. In this drawing, the abscissa axis is the distance from the center of the substrate, and the ordinate axis is the PL wavelength of the deposited InGaAsP crystal.

Figure 21:
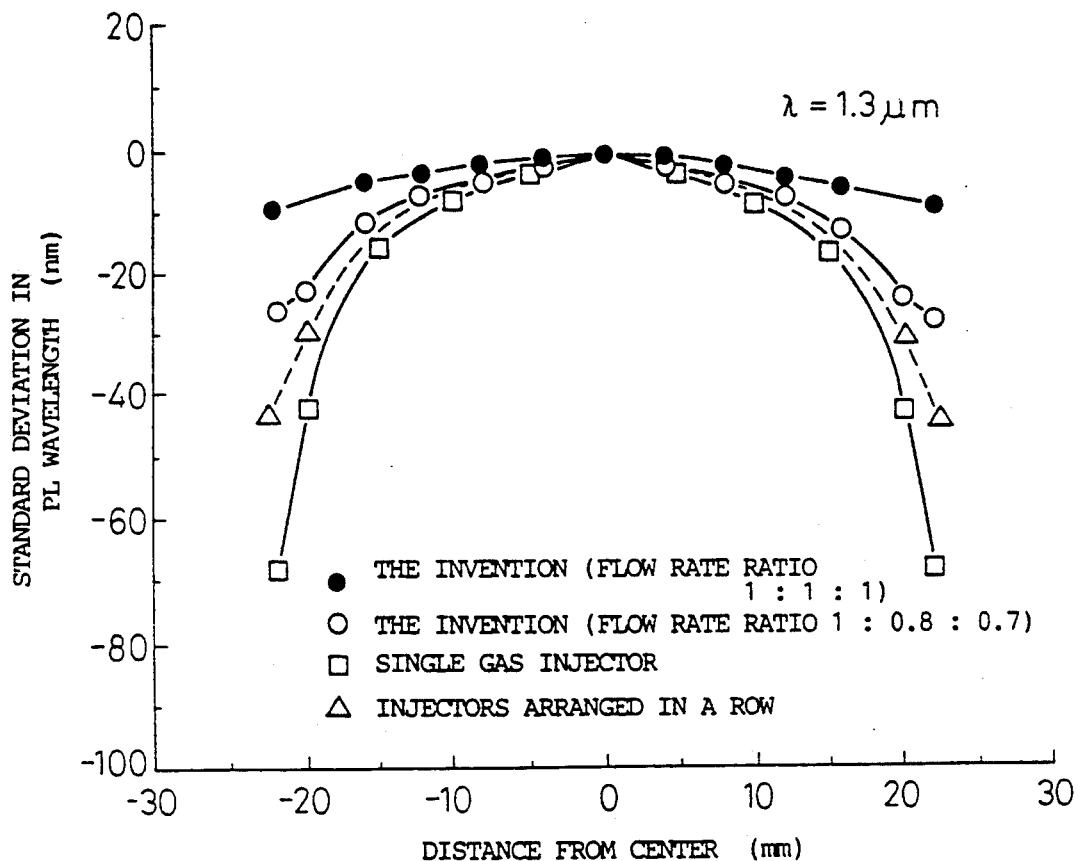
FIG. 21 is a graph showing standard deviation data of the respective PL wavelengths of InGaAsP layers deposited on 2 inch InP substrates according to the invention in comparison with those deposited according to a prior art.

FIG. 21 is a graph showing distributions in standard deviation of PL wavelength of InGaAsP crystals deposited on 2 inch InP substrates by using flow ratios [a, b, c] of [1 : 1 : 1] and [1 : 0.8 : 0.7] according to the present invention, in comparison with those of an InGaAsP crystal deposited in a conventional vertical furnace using a single gas injector and an InGaAsP crystal deposited by supplying a deposition gas from sub-injectors arranged in a row using the flow rate control technique described in Japanese Unexamined Patent Publication No. 1-140712. The standard deviation in PL wavelength was ±3.0 nanometers (excluding the edge of the substrate) in the case of the flow rate ratio [a, b, c] of [1 1 : 1] according to the invention, whereas the standard deviations in PL wavelength were on the order of ±10 nanometers, excluding the edge of a substrate, both in the case of the conventional vertical furnace using a single gas injector and in the case of the gas flows having controlled flow rates and supplied from sub-injectors arranged in a row.

From the above results, it is found that, with the crystals of quaternary compound semiconductor deposited according to the invention, the uniformity is largely improved in both the film thickness and the composition ratio, in comparison with those deposited in prior vertical furnaces, and particularly, the uniformity in composition ratio is largely improved even in comparison with the case of supplying deposition gas flows having controlled flow rates from sub-injectors arranged only in a row and not covering the entire surface of a substrate.

Of course, although the method and apparatus of the present invention are thus particularly useful for the deposition of a crystal of a quaternary compound semiconductor such as InGaAsP and AlGaInP, they also may be advantageously applied to the deposition of a crystal of a binary or ternary compound semiconductor.

Figure 22:
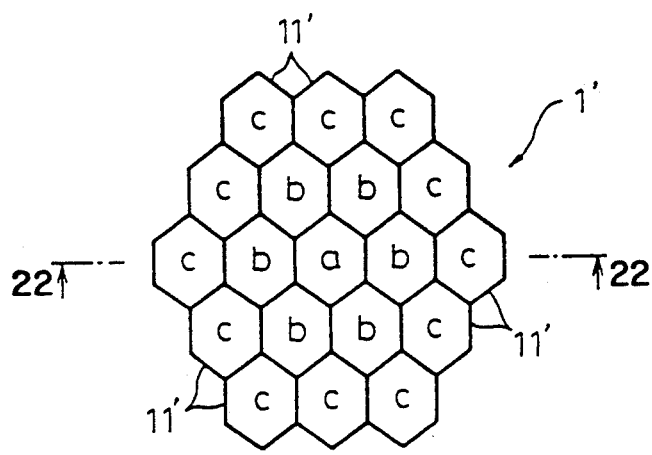
FIG. 22 is an illustration of a gas injector composed of regular-hexagonal sub-injectors.

Another embodiment of the gas injector in the invention will now be described. A gas injector 1' shown in FIG. 22 is formed by disposing 19 regular hexagon sub-injectors 11' in the form of a honeycomb, in such a manner that no spatial gaps exist between the adjacent sub-injectors 11'. In the same way as for the circular sub-injectors 11 illustrated in FIG. 13, these sub-injectors 11' also comprise the center sub-injector designated a, the group of intermediate sub-injectors designated b, and the group of end, or outer, sub-injectors designated c.

The length of a side of the regular hexagon of the sub-injectors 11' may be on the order of about 7 millimeters in the case of a 2 inch substrate, and on the order of about 10 millimeters in the case of a 3 inch substrate; and if the total of 19 sub-injectors are disposed as in the drawing, the outer diameter of the entire gas injector 1' is about 60 millimeters in the former case, and about 90 millimeters in the latter case. The length from the inlet to the outlet of the gas injector 1' may be about 150 millimeters, for example.

In the gas injectors formed by disposing 19 regular hexagon sub-injectors as in FIG. 22, the areas of the residence portions (the non-flow portions) of gas in a vertical flowing region of the deposition gas supplied to a substrate are controlled on the order of about 10 percent of the vertical flowing region, assuming that the thickness of the sub-injector is 1 millimeter, for example. In contrast, with the gas injectors formed by arranging 19 circular sub-injectors having an outer diameter of 14 millimeters as in FIG. 13, the residence portions of gas in a vertical flowing region reach about 46 percent of the total area of the vertical flowing region, assuming that the thickness of the sub-injector is also 1 millimeter. Since the gas in the residence portion does not flow, the larger the rate of the residence portion, the more disadvantageous this is to the quick switching of a deposition gas, as when forming a heterojunction. Therefore, particularly in such a case, an advantageous gas injector is formed by arranging sub-injectors in such a manner that no gaps are spatially produced, as shown in FIG. 22.

Figure 23:
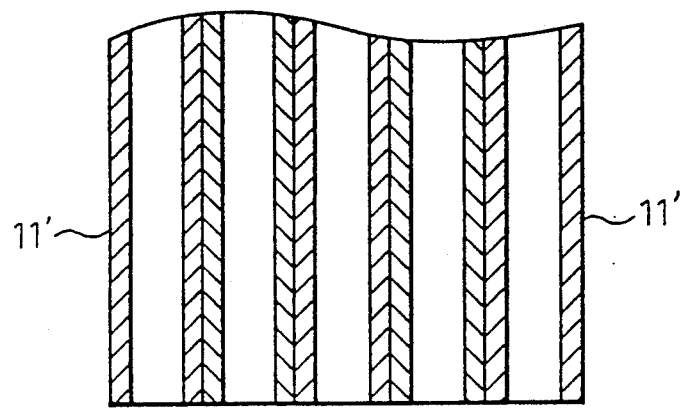
FIG. 23 is a cross section taken in a plane along the line 22—22 in FIG. 22; and, FIG. 24 is a cross section showing sub-injectors, the tube walls at the end portion of which have been obliquely whittled.
Figure 24:
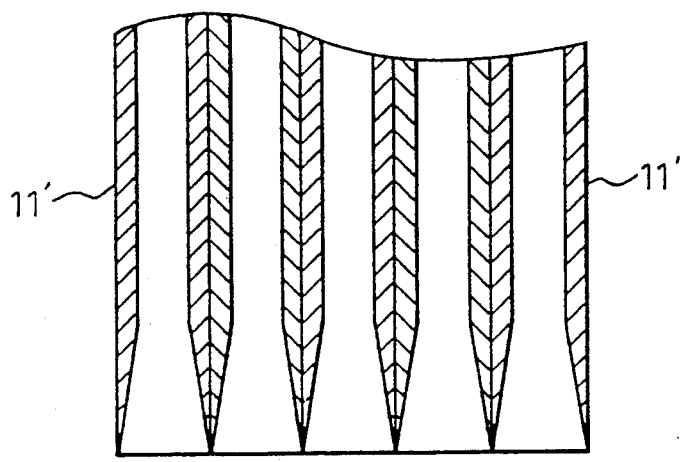

FIG. 23 shows the portion of the section of the gas injector in FIG. 22 taken along the line B—B', on the side of a reaction chamber. Even when regular hexagon sub-injectors are bundled in the form of a honeycomb, a residence portion of gas corresponding to at least the side wall thickness of the sub-injectors 11' is still produced. To eliminate this, it is advantageous to extend the openings of the sub-injectors 11' by obliquely reducing the thickness of the tube side walls at the respective end portions, as shown in FIG. 24. In this way, the wall thickness at the bottom face of the gas injector facing a substrate can be made as thin as possible, to thereby minimize the residence portion.

We claim:

1. An apparatus for depositing a crystal of a compound semiconductor on a substrate positioned in a substantially horizontal plane on a susceptor within a reaction enclosure of a reaction chamber of a reaction system, by utilizing a depositioning as containing at least two material cases of the constituent elements of the compound semiconductor crystal to be deposited, the reaction system including means for heating the substrate when positioned on the susceptor within the reaction enclosure and a gas exhaust system for exhausting spent deposition gas, containing a bi-product of a pyrolysis reaction of the material gases, from within the reaction enclosure to the outside of the reaction chamber, the apparatus comprising:

a gas supply system which supplies the deposition gas in a plurality of flow paths defining a corresponding plurality of gas streams o the deposition gas and which further comprises a plurality of control means, respectively associated with the plurality of flow paths, for individually adjusting the respective flow rates of the plurality of deposition gas steams in the respectively associated plurality of flow paths; and a gas injector comprising a plurality of gas jet ports respectively associated with and connected to the plurality of deposition gas flow paths for producing a corresponding plurality of gas jets, the gas jet ports being arranged in a two-dimensional array with the gas jet ports vertically oriented and each contiguous to adjacent jet ports of the array and disposed within the reaction enclosure so as to produce a corresponding two-dimensional pattern of gas jets which are directed vertically onto and substantially uniformly cover the main surface of the substrate on which the crystal is to be deposited.

2. The apparatus as recited in claim 1, wherein the deposition gas includes a carrier gas in addition to have at least two material gases, and wherein the gas supply system further comprises:

a manifold;

means defining corresponding supply flow paths of each of the at least two material gases and the carrier gas; and respective mass flow controllers provided in the supply flow paths of the at least two material gases and the carrier gas; and means for regulating the rate of the flow of each of the at least two material agases and the carrier gas in the respective flow paths thereof for supply to the manifold, the manifold mixing the gases as supplied thereto for producing the deposition gas.

3. The apparatus as recited in claim 1, further comprising:

means, downstream to the respective control means in at least selected ones of the gas flow paths, for dividing the respective, flow paths into divided flow paths defining corresponding, divided gas streams; and the gas injector further comprising a gas jet corresponding to each divided flow path and connected thereto to receive the corresponding, divided gas stream flowing therein.

4. The apparatus as recited in claim 1, wherein the gas injector comprises at least a central gas jet port and at least a firs group of plural gas object ports positioned in contiguous relationship with each other and in surrounding and contiguous relationship with the central gas jet port.

5. The apparatus as recited in claim 3, wherein:
the gas jet ports of the gas injector are disposed in a two-dimensional array comprising a central gas jet port, a group of intermediate gas jet ports disposed in contiguous relationship with respect to each other and in contiguous and surrounding relationship with respect to the central gas jet pot and a further group of outer gas jet ports disposed in contiguous relationship with respect to each other and in contiguous and surrounding relationship with respect to the intermediate gas jet ports, the gas jet ports of the array correspondingly producing a two-dimensional pattern of a central gas jet, plural intermediate gas jets and plural outer gas jets which are directed respectively onto corresponding central, plural intermediate and plural outer areas of the main surface of the substrate and which uniformly cover the mains surface of the substrate.

6. The apparatus as recited in claim 1, wherein each of the plurality of gas jet ports of the gas injector has a circular cross-sectional configuration.

7. The apparatus as recited in claim 1, wherein each of the plurality of gas jet ports of the gas injector has a regular hexagonal cross-sectional configuration.

8. The apparatus as recited in claim 6, wherein:
each gas jet port is defined by a surrounding sidewall having a lower, end portion from which the gas jet is released; and
the lower, end portion of the sidewall of each gas jet port is tapered and disposed in contiguous relationship with respect to the tapered end portion of each respectively adjacent gas jet port.

* * * * *

UNITED STATES PATENT AND TRADEMARK OFFICE
CERTIFICATE OF CORRECTION

PATENT NO. : 5,304,247
DATED : April 19, 1994
INVENTOR(S) : Makoto KONDO et al.

It is certified that error appears in the above-indentified patent and that said Letters Patent is hereby corrected as shown below:

Col. 2, line 36, change "composition" to --decomposition--;
line 65, after "Nevertheless," insert --in--.

Col. 3, line 7, after "group" insert --V raw materials commonly used--.

Col. 4, line 52, change "substrates" to --substrate--.

Col. 6, line 42, after "may" insert --be--.

Col. 9, lines 45-46, delete "In the drawing, the respective flow paths from MFC2 to MFC10".

Col. 15, line 3, change "firs" to --first--;

Col. 16, line 4, change "mains" to --main--.

Signed and Sealed this

Fourth Day of October, 1994

Attest:

BRUCE LEHMAN

Attesting Officer

Commissioner of Patents and Trademarks